(12) United States Patent
Butler et al.

(10) Patent No.: US 10,101,386 B2
(45) Date of Patent: Oct. 16, 2018

(54) REAL TIME SEMICONDUCTOR PROCESS EXCURSION MONITOR

(71) Applicant: Texas Instruments Incorporated, Dallas, TX (US)

(72) Inventors: Kenneth Michael Butler, Richardson, TX (US); John Michael Carulli, Jr., Richardson, TX (US)

(*) Notice: Subject to any disclaimer, the term of this patent is extended or adjusted under 35 U.S.C. 154(b) by 963 days.

(21) Appl. No.: 14/180,457

(22) Filed: Feb. 14, 2014

(65) Prior Publication Data

US 2015/0234000 A1    Aug. 20, 2015

(51) Int. Cl.
| | |
|---|---|
| *G01R 31/00* | (2006.01) |
| *G06F 19/00* | (2018.01) |
| *G01R 31/28* | (2006.01) |
| *H01L 21/66* | (2006.01) |

(52) U.S. Cl.
CPC .......... *G01R 31/2894* (2013.01); *H01L 22/14* (2013.01); *H01L 22/20* (2013.01); *G01R 31/2831* (2013.01)

(58) Field of Classification Search
CPC ..... H01L 21/00; H01L 2221/00; H01L 22/14; G01R 31/2894; G01R 31/2831
USPC .............................. 324/537, 759.03; 700/109
See application file for complete search history.

(56) References Cited

U.S. PATENT DOCUMENTS

| | | | | |
|---|---|---|---|---|
| 2008/0238460 A1* | 10/2008 | Kress | ................. | G01R 31/2891 324/756.02 |
| 2010/0007359 A1* | 1/2010 | Booth | ............... | H01J 37/32935 324/658 |
| 2011/0054659 A1* | 3/2011 | Carlson | .............. | G01N 21/9501 700/109 |

* cited by examiner

*Primary Examiner* — Farhana Hoque
(74) *Attorney, Agent, or Firm* — Rose Alyssa Keagy; Charles A. Brill; Frank D. Cimino

(57) ABSTRACT

Semiconductor process excursions may be monitored by fabricating functional circuitry on a plurality of semiconductor devices and then testing the functional circuitry of the plurality of semiconductor devices using a sequence of test patterns. A cumulative failure curve may be determined that has points of discontinuity based on results of testing with the sequence of test patterns. A point of discontinuity magnitude at a selected location in the cumulative failure curve may be compared to an expected discontinuity magnitude. Process excursion analysis may be indicated when a point of discontinuity magnitude exceeds an expected magnitude threshold.

27 Claims, 5 Drawing Sheets

REAL TIME SEMICONDUCTOR PROCESS EXCURSION MONITOR

FIELD OF THE INVENTION

This invention generally relates fabrication of semiconductor devices, and in particular to the detection of process excursions during the fabrication process.

BACKGROUND OF THE INVENTION

Semiconductor products are mass produced by fabricating circuitry on wafers in large factories called "fabs". Electronic circuits are gradually created on a wafer made of pure semiconducting material. Typically, the wafers are silicon based, but other types of materials, such as Gallium Arsenide, Gallium Nitride, Silicon Carbide, etc. may also be used for special applications. In semiconductor device fabrication, the various processing steps typically fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD), among others.

Removal is any process that removes material from the wafer; examples include etch processes (either wet or dry) and chemical-mechanical planarization (CMP).

Patterning is the shaping or altering of deposited materials, and is generally referred to as lithography. For example, in conventional lithography, the wafer is coated with a chemical called a photo-resist; then, a machine called a stepper focuses, aligns, and moves a mask, exposing select portions of the wafer below to short wavelength light; the exposed regions are washed away by a developer solution. After etching or other processing, the remaining photo-resist is removed by plasma etching.

Modification of electrical properties has historically entailed doping transistor sources and drains. This is typically done by diffusion furnaces or by ion implantation. These doping processes are followed by furnace annealing; in advanced devices, rapid thermal annealing (RTA) may be performed. Annealing serves to activate the implanted dopants. Modification of electrical properties may be performed using other techniques, such as by reducing a material's dielectric constant in low-k insulators via exposure to ultraviolet light in UV processing (UVP), for example.

After the wafers are completed and tested, the good devices resulting from that step are typically packaged and then tested again after the packaging process. In some cases, there may be multiple probe test steps and/or multiple package test steps. The steps used to produce the wafers and packaged devices are very complicated and the complexity grows with each subsequent generation of semiconductor technology. There are many opportunities for simple errors and complex interactions in the manufacturing process which can lead to the creation of defective devices.

BRIEF DESCRIPTION OF THE DRAWINGS

Particular embodiments in accordance with the invention will now be described, by way of example only, and with reference to the accompanying drawings.

Figure 1:
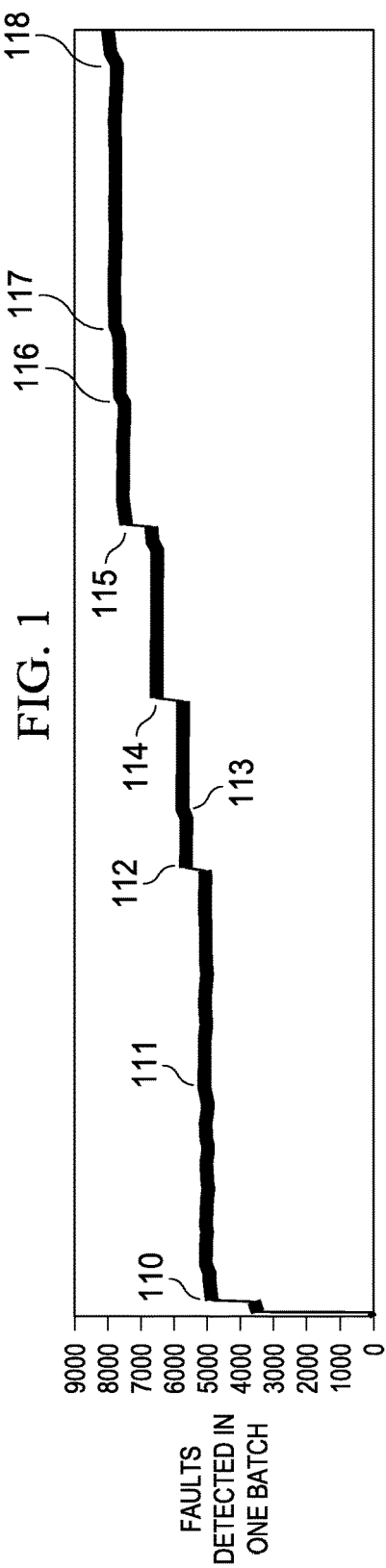
FIG. 1 is an example plot of cumulative failures for a sequence of test patterns applied to a batch of semiconductor devices.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

As described above, semiconductor products may be mass produced on semiconductor wafers in large factories called "fabs". After the wafers are completed and tested, the good devices resulting from that step are typically packaged and then tested again after the packaging process. The steps used to produce the wafers and packaged devices are very complicated and the complexity grows with each subsequent generation of semiconductor technology. There are many opportunities for simple errors and complex interactions in the manufacturing process which can lead to the creation of defective devices. Typically, wafer fabrication processing and the associated in-line metrology and testing processes have not included an ability to detect non-catastrophic (sub-1%) wafer process yield excursions quickly after an excursion occurs, or at all.

Embodiments of the invention may utilize automated analysis of test data combined with knowledge of details of test patterns used in production to automatically identify die and or wafers with low level (sub-500 DPPM) unusual or unexpected failures immediately upon completion of a wafer probe.

Embodiments are not restricted to just wafer fabrication or wafer test data. The process excursion detection method described herein is applicable to investigating design/process/test yield interactions from the wafer fab through intermediate processing such as bump, redistribution layers, packaging, etc. Test data is needed at least at one test insertion point. This may be wafer level testing, package level testing, system level testing, etc, as long as test stimuli are being applied and the test status (such as pass/fail, for example) is being logged.

In various embodiments, the test stimulus may be directed to digital structured test, functional test, analog-mixed signal/RF test, memory test, and system test, for example. In many cases, a digital type stimulus, structural or functional, may only provide a pass/fail response. However, other tests may provide a continuous variable as an output that may then be compared to a specification and then a status set as pass or fail. This technique may be used for series of stimulus applied to a device under test, for example.

Solutions exist to the similar problem of identifying more gross excursions by monitoring yield or bin data and looking for large changes in those metrics. However, these solutions have significant difficulty assessing yield issues below about 1%. The main reasons are the resolution of the fail criteria and the aggregation of many fail modes, potentially dissimilar, across many manually set bin groups.

The technique described herein may utilize finer resolution available in the test pattern data to identify much smaller "signals" that are available in the wafer probe data. This may be automated and tied to design aggregations that are more meaningful and do not "smear" fails across multiple bins but rather amplify subtle fail signatures by meaningful design groupings.

The technique described herein may be further refined by tying in volume scan fail diagnosis. The data may also be wafer mapped for spatial signature identification or piped in to other standard analysis tools. The variance reduction gained by more precise fail categorization may greatly improve root cause and correlation analyses.

Thus, embodiments of the invention may provide earlier warning of negative impact of process changes or excursions than are currently available using yield or bin monitors.

Several sources of error will now be described briefly. The following list of error sources is only an example of the multiple sources of error that may affect wafer fabrication and device packaging processes. Since wafer fabrication is well known, there is no need to describe the error sources in detail herein.

For example, wafer fabs typically produce many different products with different recipes at the same time and with the same pieces of equipment. If the equipment settings are not correct from one run to the next, or if the proper equipment cleaning and maintenance schedule is not followed, variability in results can be observed. The manufacturer may intentionally alter a particular processing step in an attempt to remedy a known problem which may induce other failures. Equipment may either fail or go out of control during a processing step. Operator errors or errors due to operator shift changes may induce failures. Excessive wait times at a processing step may cause problems while the material sits in the queue for a piece of equipment. Unforeseen interactions between two pieces of equipment used on the same product may result in random failures. Errors in handling the material may cause device damage which may result in failures at any point in the overall manufacturing process. Addition of new equipment that is qualified and within specification for known release parameters but may have an uncharacterized subtlety may generate a low level failure rate. Technology may be released with a subtle systematic low level failure rate that is not detected initially with existing yield analysis. A larger failure rate may occur later that looks like a process excursion that comes and goes over time or across devices.

The above examples are just a very small number of the numerous sources of potential errors in semiconductor manufacturing. The errors range from seemingly random events classified as "excursions", "anomalies", or "maverick" to systematic signatures that may be at or below existing measurement capabilities to observe.

Due to the complexity of device manufacturing, the large number of potential errors sources, and the high cost of scrapped material and yield loss, it is very important to be able to detect and remove all defect-inducing situations as soon as they occur. For catastrophic errors, one need simply monitor very simple metrics such as yield or bin percentages. Yield is the fraction of "good" devices that emerge from a process step. This is typically either wafer yield during wafer manufacturing or package yield during package manufacturing. Bin percentage refers to the fraction of devices as a sub-group with particular category attributes. Some examples may be "good" units, "good" units with repaired memories, units which fail only memory test patterns, units which fail only logic test patterns, and units which fail only analog tests. If a particular bin fraction varies too much over a large sequence of material through a manufacturing operation, then that variation or trend can be detected and used to trigger investigation as to its source.

The foregoing process works well in situations where the fluctuation in a particular bin yield is relatively large, say 0.5% or greater. At higher bin yield losses, it is generally possible to observe a dominant root cause mechanism that can be identified and corrected. As bin yield losses go below this rough threshold, there are likely several different manufacturing root cause mechanisms responsible for the failures. At this point, from a root cause perspective, the noise floor of a bin is being measured and it is difficult to discern a low level systematic yield loss mechanism from the multiple random low level yield loss mechanisms In modern semiconductor manufacturing, fluctuations can be much more subtle and thus harder to detect with "gross" metrics such as the ones named above. A 0.5% capability threshold is the same as 5000 defective-parts-per-million (DPPM). Many customers are expecting quality capability down to 500 DPPM and lower. This implies a method is needed to accurately identify fail signatures down to 0.05% or lower in yield. This is not generally possible with the relatively large and pre-defined bin category classifications where a single root cause for failures may be distributed and diluted across several bins.

A process that can provide a failure detection mechanism for subtle deviations in the manufacturing process by leveraging more precise design attribute and test information down to the single test pattern level will now be described.

Without loss of generality, a modern semiconductor product may be composed of logic gates, memory blocks, and/or analog circuitry. Considering the logic portion of the design for a moment, test patterns for logic are typically generated using specialized software referred to as automatic test pattern generators or ATPGs. ATPG tools use simple fault models which represent the ways in which a circuit can fail, and then derive tests which maximize the coverage of all the possible faults that could occur within a portion of logic circuitry.

FIG. 1 is an example plot of cumulative failures for a sequence of test patterns applied to a batch of semiconductor devices. As the sequence of patterns is applied to a batch (wafer, lot, etc) of manufactured devices, one can plot the cumulative failures that are detected as each subsequent pattern is applied to the devices, as illustrated in FIG. 1, where the Y axis represents fault detection and the X axis represents the test pattern number.

Note that there may be points of discontinuity in the detected failures curve, such as indicated at 110-118, for example. For most designs, it is normal to have these discontinuities. There may be several reasons for the occurrence of excursions in the failure curve for a given batch of devices. For example, the portion of the design may have more than one clock signal, and each time ATPG changes to a different clock, there is a jump in the associated cumulative failures. The design may be composed of several different sub-blocks, each of which is tested individually in sequence, and when the patterns change from one sub-block to the next, there is a discontinuity in the cumulative failures curve. The fault model or pattern type may be changed in a larger sequence of patterns, and with the change in fault model comes a change in the overall cumulative failures.

Typically, the reasons for discontinuities in detected failures from reasons such as those above are known in advance of testing and may also be verified through collection and analysis of test data after the production test program has been implemented and is verified to be stable. Once this information is known, one can continue to monitor this data in production and also establish limits or controls which specify the amount of discontinuity permissible at each point along the detected failures curve. As one progresses along the curve from left to right, the amount of discontinuity that is allowed will grow smaller since most failures are expected to be detected by the time the majority of patterns have been applied to the device (i.e., at the right side of the cumulative failures curve). If one detects an abnormally large discontinuity at any point along the cumulative failures curve at any time during manufacturing, that fact may be indicative of a process excursion that has occurred, a systematic process shift, or other subtle design-process interaction. Further investigation would then be warranted to uncover the reason for the process excursion.

This procedure not only detects a shift at very low DPPM fail levels, but also can provide clues as to the cause. If one quickly examines the devices associated with the unacceptably large discontinuity in failures, that information, combined with the passing information for other patterns applied to the same devices, may provide clues as to the reason for the anomaly. One example of just this sort of analysis is shown in FIG. 2.

Figure 2:
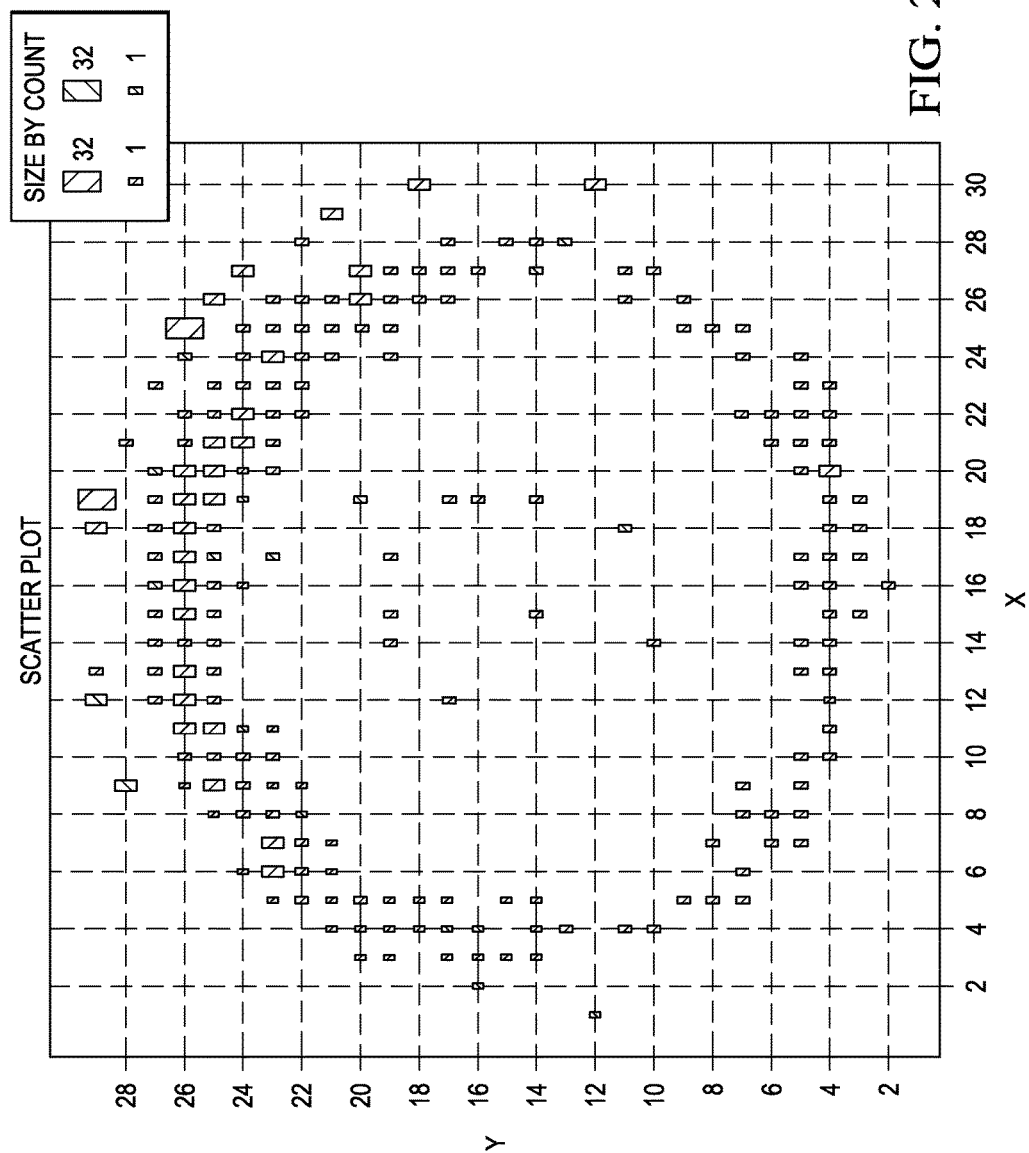
FIG. 2 is an example plot of the X/Y wafer positions of a die associated with a particular discontinuity in a plot of cumulative failures for a semiconductor device.

FIG. 2 is an example plot of the X/Y wafer positions of each die associated with a particular discontinuity in a plot of cumulative failures for a semiconductor product. Typically, each die may include tracking information that allows its location within a wafer to be known both during wafer probe and after the wafer as been divided up and the dies have been packaged. For example, discontinuity 115, referring back to FIG. 1, may be flagged as unusual. In this example, the X and Y positions of the die associated with a selected discontinuity 115 in cumulative failures from a sample of wafers from one product were plotted and the results clearly indicate that some sort of process signature shift has occurred which led to the larger-than-expected failures seen in production. Furthermore, the fault coverage for the failing pattern file along with information from other pattern files that are passing may suggest where on each die the associated individual failing logic elements (e.g., gates) are located. Physical examination of the failing gates or regions may then lead to specific process steps that should be corrected.

FIG. 2 is only an example of the type of analysis that may be performed once a larger than expected discontinuity is discovered. In addition to plotting locations of failures on a wafer, other known process excursion analysis techniques may be used.

The foregoing discontinuity analysis technique may be far more sensitive than simply looking at yield or bin excursions. There may be thousands or tens of thousands of test sequences, while a typical test station may only be able to sort failed parts into a dozen or fewer output bins. Discontinuity analysis may more easily detect process anomalies at rates of hundreds of DPPM or below. Furthermore, the technique may be generalized to the other portions of the die, for example, specific memory test algorithm failures for memory testing or specific specification measurement failures for analog testing, for example.

Figure 3:
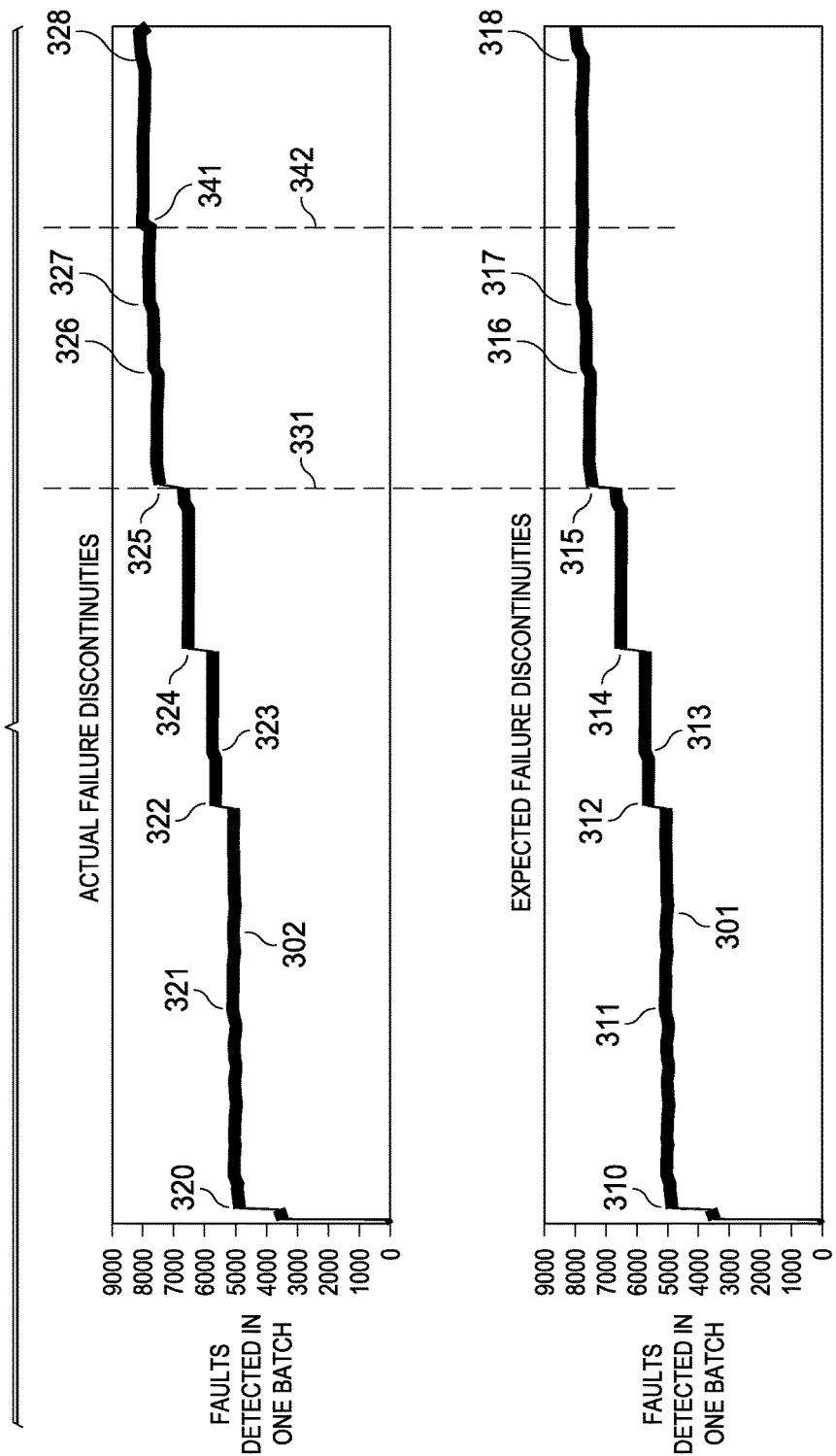
FIG. 3 is an example plot of expected and actual cumulative failures for a sequence of test patterns applied to a semiconductor device.

FIG. 3 is an example plot of expected cumulative failures 301 and actual cumulative failures 302 for a sequence of test patterns applied to a batch of semiconductor devices. The expected cumulative failure plot 301 may be produced by simulation, or it may be the result of testing previous batches of devices. Simulation of a device design may be performed in which the sequence of test patterns is applied to the simulated design of the device. Various "stuck at 0/1" or other known fault model error conditions may be inserted based on known process results, for example, to determine an expected failure rate and to determine which test pattern detects the error. In this manner, an expected cumulative failure plot, such as plot 301, may be developed for a device design.

When prior test data is used to produce expected cumulative failure plot 301, then care should be taken to establish a good baseline plot. Once a baseline plot is selected, updates should be done only in a monitored manner; otherwise, gradual process excursions may be masked and therefore overlooked.

For example, expected cumulative failure plot 301 may represent of batch of 100 wafers where each wafer produces 1000 individual die which may then be packaged into a total of 10,000 devices. For this example, assume the device is a microcontroller (MCU) with logic circuits, memory, and analog circuits. In this example, after several test patterns have been executed, nearly 5000 failures are detected at point 301. As more test patterns are executed, additional failures are detected, with significant discontinuities detected as indicated at 311-318.

During production of the MCU device, test data results for a same size batch may be produced and plotted to form cumulative failure plot 302. The magnitude of each discontinuity in the production data, such as 320-328, may be compared to the corresponding expected discontinuity magnitude in plot 301. If a production discontinuity magnitude exceeds an expected discontinuity magnitude by a threshold amount, then this may be an indication that a process excursion analysis should be performed. The threshold amount may be predefined amount, such as a percentage of the magnitude, an absolute number of failures, etc, for example.

The threshold amount may be selected based on known variability of the process used to fabricate the MCU device, for example. The threshold value may be adjusted for each expected discontinuity, for example. For example, discontinuity thresholds may be set higher for test patterns that are testing the memory portion of the MCU device than for test patterns that are testing logic circuitry.

For example, the magnitude of discontinuity 325 may be compared to the expected magnitude indicated at 315, as illustrated by comparison line 331. If the production discontinuity 325 exceeds an expected discontinuity 315 by a threshold amount, then this may be an indication that a process excursion analysis should be performed.

During production testing, one or more unexpected discontinuities may be detected. For example, a discontinuity 341 may be detected between discontinuities 327 and 328 with no corresponding discontinuity between expected discontinuities 317 and 318, as indicated by comparison line 342. Such an occurrence of an unexpected discontinuity may be an indication that a process excursion analysis should be performed.

In the example of FIG. 3, the batch size for the expected cumulative failure plot 301 and the actual cumulative failure plot 302 are the same size. For cases where the batch sizes are different, then the discontinuity magnitudes and threshold values may be scaled accordingly to allow valid comparisons.

Figure 4:
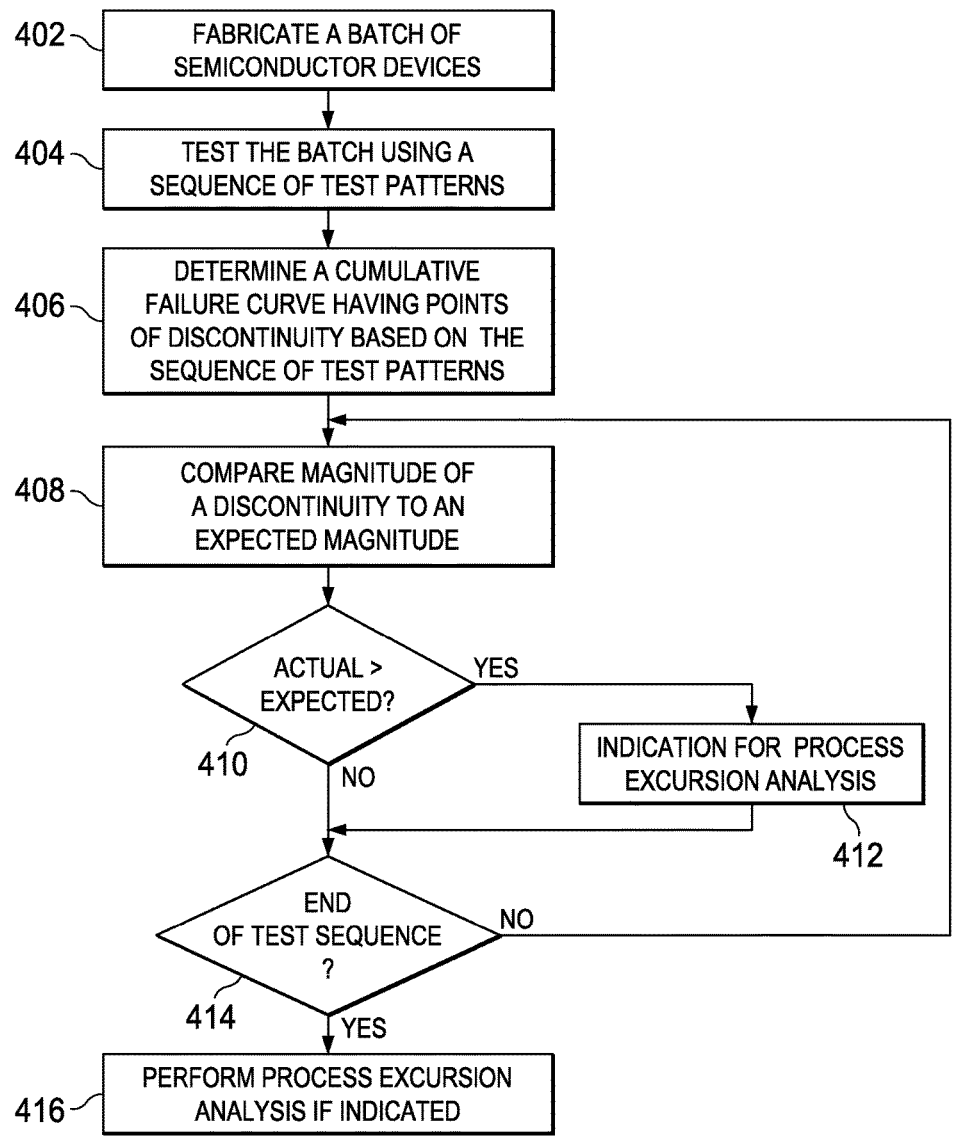
FIG. 4 is a flow diagram illustrating real time process excursion monitoring.

FIG. 4 is a flow diagram illustrating real time process excursion monitoring. A semiconductor device is designed, released to production, and manufactured 402. As discussed above, excursion analysis may be monitored during various phases of production, such as during wafer fabrication, bump formation, redistribution layer processing, packaging, etc., for example.

Test patterns for the various portions of the design are generated and a production test program(s) is created using those test patterns. Anticipated points of discontinuity in cumulative failures may be identified as discussed in more detail above. The production material is subjected 404 to the test program while collecting failing test data that may be used to extract one or more cumulative failure curves 406.

The resulting curve(s) is/are compared 408 to the anticipated points of discontinuity to determine the acceptable limits on discontinuities across the entire cumulative failure curve.

Production tests data is collected, the cumulative failures are calculated, and any discontinuities beyond the acceptable limits 410 are identified 412. Typically, all of the discontinuities 414 in the cumulative failure plot are compared to expected results.

Whenever discontinuity limits are surpassed, the resulting material may be identified for further analysis 416 so that root cause(s) may be identified. As discussed above, there are many known types of analysis that may be performed to determine if a process excursion has occurred. By identifying a small group of devices that are flagged based on a single discontinuity in the test pattern sequence, the analysis may be targeted to that set of chips and therefore a low level process problem may be exposed. If there is more than one unexpected discontinuity, then additional sets of devices may be identified and each set may be identified by the test number during which it failed.

In this manner, embodiments of the invention may utilize automated analysis of test data combined with knowledge of details of test patterns used in production to automatically identify die and or wafers with low level (sub-500 DPPM) unusual or unexpected failures immediately upon completion of a wafer probe. As mentioned above, while the expected discontinuity data may be developed based on a large number of devices, the expected discontinuity data may be scaled such the test results from a single wafer probe may be analyzed as described herein.

Embodiments are not restricted to just wafer fabrication or wafer test data. The process excursion detection method described herein is applicable to investigating design/process/test yield interactions from the wafer fab through intermediate processing such as bump, redistribution layers, packaging, etc. Test data is needed at least at one test insertion point. This may be wafer level testing, package level testing, system level testing, etc, as long as test patterns are being applied and the test status (pass/fail) is being logged.

Figure 5:
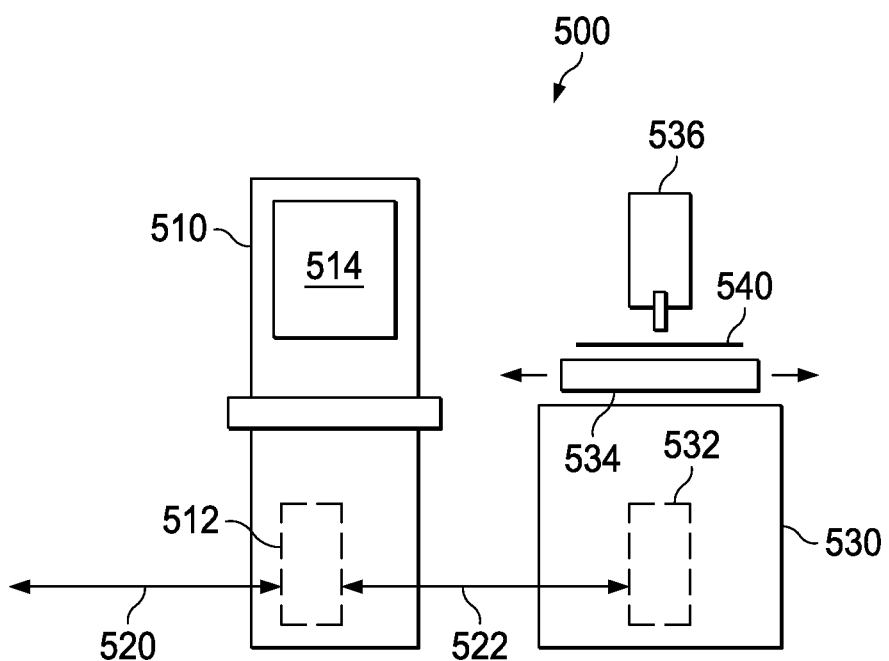
FIG. 5 is an illustration of a production test system that may be used to separate out small sets of devices for process excursion analysis.

FIG. 5 is an illustration of a production assembly and test (A/T) facility 500 that may be used to separate out small sets of devices for process excursion analysis that are identified based on a particular discontinuity in the cumulative failure plot for a batch of devices. A/T facility 500 is representative of many currently available and well known or later developed A/T facilities, and therefore need not be described in detail herein. However, A/T facility 500 will now be described briefly to aid in understanding embodiments of the invention.

Pick and place (P/P) station 530 supports a wafer table 534 that is servo-controlled to move in a two dimensional manner with respect to pick assembly 536. A wafer 540 that is to be processed is placed on wafer table 534 and moves with it. Pick assembly 536 is servo-controlled to pick die from a wafer 540 as the wafer is indexed to position by wafer table 534. P/P station 530 may contain control logic 532 that is operable to control the servo mechanisms.

Control station 510 may provide an interface for a human operator and may contain a display 514 along with other interface devices needed by an operator to control P/P station 530, such as a keyboard, a joystick, or similar interface for manually controlling wafer table 534, actuator buttons, etc, for example. Control station 510 may contain control electronics 512 that provide control functions for A/T facility 500.

Control electronics 512 may be coupled to control logic 532 via cable 522. Control electronics 512 may also be coupled to other data systems in the production plant via local or wide area network connection 520. Control electronics 512 and control logic 532 may be located in separate cabinets, as illustrated, or may be implemented in a single cabinet local to P/P station 530 or may be remotely located in another part of the production facility, for example.

An A/T facility, such as A/T facility 500, may be loaded with a wafer 540 that then undergoes sawing to singulate the dice. P/P station 530 then performs pick and place processing based on a wafer map for wafer 540. The wafer map specifies the exact location of all good dice and is used to control an accept/reject function of a P/P station 530. Wafer maps are normally received from offsite locations such as Wafer Fab or Probe sites via network connection 520. A wafer map is a set of information that is used by process equipment when handling a wafer at its workstation. The map data includes the coordinates of each die on a wafer, bin assignments for good dies and reject dies, wafer orientation or rotation, and the wafer identification that is used to associate the wafer map with the physical wafer, for example. The wafer map may also contain the initial failing test pattern number for each rejected die, for example.

The wafer map host system, located in the production facility, receives the map data, provides storage, and enables data download into the production equipment to support processing of wafers to manufacture a semiconductor product. The wafer map host system transforms the lot's wafer map file into a suitable map file for the pick and place equipment to handle and prepares them for equipment download. In the manufacturing floor, as the wafer goes through the assembly process, a barcode may be generated for the wafer identification (ID) and is attached to the wafer or to a carrier frame. When the wafer is ready to be processed at the pick and place equipment, the frame or wafer ID barcode is scanned and is used to request the wafer map from the wafer map host system. P/P station 530 uses the downloaded wafer map to step to the good chips for pick-up.

Each wafer 540 contains a plurality of integrated circuit dice. The wafer map identifies the exact location of each die using a coordinate system that corresponds to the physical structure of the wafer. The probe test results (die quality)

may be expressed as a single bit value, e.g., good (accept) or bad (reject), or a multiple bit value that provides additional information such as good first grade, good second grade, etc. The wafer map includes a plurality of bin numbers to categorize various attributes and/or properties of each die. For example, bin 1 may contain identification of all good first grade dice, bin 2 may contain identification of all good second grade dice, bin 3 may contain identification of all plug dice, bin 4 may contain identification of all bad dice, and bin 5 may contain identification of all edge bad dice. Each die may be assigned to a particular bin based on the results of the probe testing.

As described in more detail above, a particular set of die may be indentified based on an unexpectedly large discontinuity in a cumulative failure plot. A discontinuity analysis of the cumulative failure plot for a wafer as described in FIG. 4, for example, may be performed by control electronics 512, for example, or may be performed by another computer system that is coupled to A/T system 500, for example. This set of die may be assigned to a particular bin based on the failing test pattern number and may then be used during an analysis to determine if a small process excursion caused a higher than expected failure rate. If multiple discontinuities were flagged, then additional corresponding small sets of die may be sorted into additional bins for use in process excursion analysis.

Other Embodiments

While the invention has been described with reference to illustrative embodiments, this description is not intended to be construed in a limiting sense. Various other embodiments of the invention will be apparent to persons skilled in the art upon reference to this description. For example, embodiments are not restricted to just wafer fabrication or wafer test data. The process excursion detection method described herein is applicable to investigating design/process/test yield interactions from the wafer fab through intermediate processing such as bump, redistribution layers, packaging, etc. Test data is needed at least at one test insertion point. This may be wafer level testing, package level testing, system level testing, etc, as long as test patterns are being applied and the test status (pass/fail) is being logged.

In various embodiments, disposition actions may be handled in several ways, other than at the A/T stations as described herein. A response may be triggered inline at a test insertion at the wafer level or at package test, for example. If this is within the wafer or lot, the signal strength would depend on the sample size accrued. If a disposition trigger is not set within a test insertion run, it may happen post process, such as after the wafer or lot is completed. Responses may be fed forward to the next test insertion point to react. Alternatively, the response may be delayed and fed back to the next wafers or lots that hit the test insertion point.

Alternatively, failure data may be collected for future analysis and current parts not dispositioned at all. Alternatively, parts may be dispostioned at wafer test, at an intermediate process post wafer test (redistribution, bump, etc), at package for different package configurations, at package for additional or reduced burn-in, at shipping to segregate by customer requirements, etc, for example.

The techniques described in this disclosure may be implemented in hardware, software, firmware, or any combination thereof. If implemented in software, the software may be executed in one or more processors, such as a microprocessor, application specific integrated circuit (ASIC), field programmable gate array (FPGA), or digital signal processor (DSP). The software that executes the techniques may be initially stored in a computer-readable medium such as compact disc (CD), a diskette, a tape, a file, memory, or any other computer readable storage device and loaded and executed in the processor. In some cases, the software may also be sold in a computer program product, which includes the computer-readable medium and packaging materials for the computer-readable medium. In some cases, the software instructions may be distributed via removable computer readable media (e.g., floppy disk, optical disk, flash memory, USB key), via a transmission path from computer readable media on another digital system, etc.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A method for monitoring process excursions, the method comprising:
    fabricating functional circuitry on a plurality of semiconductor devices;
    using at least one probe of a wafer test machine to test the functional circuitry of the plurality of semiconductor devices using a sequence of test stimuli;
    determining a cumulative failure curve having points of discontinuity based on results of testing with the sequence of test stimuli;
    using a non-transitory computer-readable medium to compare a point of discontinuity magnitude at a selected location in the cumulative failure curve to an expected discontinuity magnitude; and
    performing a process excursion analysis for the plurality of semiconductor devices when the point of discontinuity magnitude exceeds an expected magnitude threshold.

2. The method of claim 1, further comprising repeating the step of comparing a point of discontinuity magnitude to an expected discontinuity magnitude for a plurality of selected locations.

3. The method of claim 1, further comprising determining an expected cumulative failure curve by simulation of the functional circuitry using the sequence of test patterns.

4. The method of claim 1, further comprising determining an expected cumulative failure curve by testing the functional circuitry of a prior plurality of semiconductor devices using the sequence of test patterns.

5. The method of claim 1, further comprising:
searching for an unexpected point of discontinuity between locations of expected known discontinuities in the cumulative failure curve; and
indicating that process excursion analysis should be done for the plurality of semiconductor devices when an unexpected point of discontinuity magnitude exceeds a magnitude threshold.

6. The method of claim 1, further comprising identifying a set of failed semiconductor devices that correspond to the point of discontinuity.

7. The method of claim 6, further comprising performing the process excursion analysis using the set of failed semiconductor devices.

8. A non-transitory computer-readable medium storing software instructions that, when executed by a processor, cause a method for monitoring process excursions to be performed, the method comprising:
using at least one probe of a wafer test machine to test functional circuitry of a plurality of semiconductor devices using a sequence of test stimuli during manufacture of the plurality of semiconductor devices;
determining a cumulative failure curve having points of discontinuity based on results of testing with the sequence of test stimuli;
comparing a point of discontinuity magnitude at a selected location in the cumulative failure curve to an expected discontinuity magnitude; and
performing a process excursion analysis for the plurality of semiconductor devices when the point of discontinuity magnitude exceeds an expected magnitude threshold.

9. The non-transitory computer-readable medium of claim 8, wherein the method further comprising repeating the step of comparing a point of discontinuity magnitude to an expected discontinuity magnitude for a plurality of selected locations.

10. The non-transitory computer-readable medium of claim 8, wherein the method further comprising determining an expected cumulative failure curve by simulation of the functional circuitry using the sequence of test patterns.

11. The non-transitory computer-readable medium of claim 8, wherein the method further comprising determining an expected cumulative failure curve by testing the functional circuitry of a prior plurality of semiconductor devices using the sequence of test patterns.

12. The non-transitory computer-readable medium of claim 8, wherein the method further comprising:
searching for an unexpected point of discontinuity between locations of expected known discontinuities in the cumulative failure curve; and
indicating that process excursion analysis should be done for the plurality of semiconductor devices when an unexpected point of discontinuity magnitude exceeds a magnitude threshold.

13. The non-transitory computer-readable medium of claim 8, wherein the method further comprising identifying a set of failed semiconductor devices that correspond to the point of discontinuity.

14. The non-transitory computer-readable medium of claim 13, wherein the method further comprising performing process the excursion analysis using the set of failed semiconductor devices.

15. An assembly test system for monitoring process excursions during fabrication of functional circuitry on a plurality of semiconductor devices, the system comprising:
a pick and place (P/P) station for semiconductor wafers, the P/P station having a plurality of output bins;
control electronics coupled to the P/P station, the control electronics also coupled to receive a wafer map with test result data derived from a sequence of test stimuli for a wafer under test from at least one probe of a wafer probe station;
wherein the control electronics are configured to perform a method, the method comprising:
determining a cumulative failure curve having points of discontinuity based on results of testing with the sequence of test stimuli;
comparing a point of discontinuity magnitude at a selected location in the cumulative failure curve to an expected discontinuity magnitude; and
performing a process excursion analysis for the plurality of semiconductor devices when the point of discontinuity magnitude exceeds an expected magnitude threshold.

16. The assembly test system of claim 15, wherein the method further comprises:
identifying a set of failed semiconductor devices that correspond to the point of discontinuity; and
causing the P/P station to sort the set of failed devices into a selected one of the output bins.

17. The assembly test system of claim 15, wherein the method further comprises:
searching for an unexpected point of discontinuity between locations of expected known discontinuities in the cumulative failure curve; and
indicating that process excursion analysis should be done for the plurality of semiconductor devices when an unexpected point of discontinuity magnitude exceeds a magnitude threshold.

18. A method for monitoring process excursions, the method comprising:
fabricating functional circuitry on a packaged semiconductor device;
using at least one probe of a package test machine to test the functional circuitry of the packaged semiconductor device using a sequence of test stimuli;
determining a cumulative failure curve having points of discontinuity based on results of testing with the sequence of test stimuli;
using a non-transitory computer-readable medium to compare a point of discontinuity magnitude at a selected location in the cumulative failure curve to an expected discontinuity magnitude; and
performing a process excursion analysis for the packaged semiconductor device when the point of discontinuity magnitude exceeds an expected magnitude threshold.

19. The method of claim 18, further comprising repeating the step of comparing a point of discontinuity magnitude to an expected discontinuity magnitude for a plurality of selected locations.

20. The method of claim 18, further comprising determining an expected cumulative failure curve by simulation of the functional circuitry using the sequence of test patterns.

21. The method of claim 18, further comprising determining an expected cumulative failure curve by testing the functional circuitry of a prior plurality of semiconductor devices using the sequence of test patterns.

22. The method of claim 18, further comprising:
- searching for an unexpected point of discontinuity between locations of expected known discontinuities in the cumulative failure curve; and
- indicating that process excursion analysis should be done for the packaged semiconductor device when an unexpected point of discontinuity magnitude exceeds a magnitude threshold.

23. A non-transitory computer-readable medium storing software instructions that, when executed by a processor, cause a method for monitoring process excursions to be performed, the method comprising:
- using at least one probe of a package test machine to test functional circuitry of a packaged semiconductor device using a sequence of test stimuli;
- determining a cumulative failure curve having points of discontinuity based on results of testing with the sequence of test stimuli;
- comparing a point of discontinuity magnitude at a selected location in the cumulative failure curve to an expected discontinuity magnitude; and
- performing a process excursion analysis for the packaged semiconductor device when the point of discontinuity magnitude exceeds an expected magnitude threshold.

24. The non-transitory computer-readable medium of claim 23, wherein the method further comprising repeating the step of comparing a point of discontinuity magnitude to an expected discontinuity magnitude for a plurality of selected locations.

25. The non-transitory computer-readable medium of claim 23, wherein the method further comprising determining an expected cumulative failure curve by simulation of the functional circuitry using the sequence of test patterns.

26. The non-transitory computer-readable medium of claim 23, wherein the method further comprising determining an expected cumulative failure curve by testing the functional circuitry of a prior plurality of semiconductor devices using the sequence of test patterns.

27. The non-transitory computer-readable medium of claim 23, wherein the method further comprising:
- searching for an unexpected point of discontinuity between locations of expected known discontinuities in the cumulative failure curve; and
- indicating that process excursion analysis should be done for the packaged semiconductor device when an unexpected point of discontinuity magnitude exceeds a magnitude threshold.

\* \* \* \* \*